United States Patent
Bowers et al.

(10) Patent No.: US 11,693,178 B2
(45) Date of Patent: *Jul. 4, 2023

(54) MONOLITHIC INTEGRATED QUANTUM DOT PHOTONIC INTEGRATED CIRCUITS

(71) Applicant: THE REGENTS OF THE UNIVERSITY OF CALIFORNIA, Oakland, CA (US)

(72) Inventors: John E. Bowers, Santa Barbara, CA (US); Arthur Gossard, Santa Barbara, CA (US); Daehwan Jung, Goleta, CA (US); Justin Norman, Goleta, CA (US); Chen Shang, Goleta, CA (US); Yating Wan, Goleta, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/882,909

(22) Filed: Aug. 8, 2022

(65) Prior Publication Data
US 2022/0390669 A1 Dec. 8, 2022

Related U.S. Application Data

(63) Continuation of application No. 17/058,057, filed as application No. PCT/US2019/033990 on May 24, 2019, now Pat. No. 11,435,524.
(Continued)

(51) Int. Cl.
G02B 6/12 (2006.01)
G02B 6/122 (2006.01)
(Continued)

(52) U.S. Cl.
CPC ....... *G02B 6/12004* (2013.01); *G02B 6/1225* (2013.01); *G02B 6/13* (2013.01); *B82Y 20/00* (2013.01)

(58) Field of Classification Search
CPC .... G02B 6/12004; G02B 6/1225; G02B 6/13; G02B 6/12; B82Y 20/00; H01L 33/04; H01L 33/30; H01S 5/026
See application file for complete search history.

(56) References Cited

U.S. PATENT DOCUMENTS 5,770,472 A * 6/1998 Zhou ................... H01Q 3/2676
438/34
7,554,109 B2 6/2009 Stokes et al.
(Continued)

FOREIGN PATENT DOCUMENTS

WO 2019227035 A1 11/2019

OTHER PUBLICATIONS

"Intel® Silicon Photonics 100G PSM4 Optical Transceiver Brief", Retrieved via : https://www.intel.in/content/www/in/en/architecture-and-technology/silicon-photonics/optical-transceiver-100g-psm4-qsfp28-brief.html, 2017, 1 page.
(Continued)

Primary Examiner — John Bedtelyon
(74) Attorney, Agent, or Firm — Billion & Armitage

(57) ABSTRACT

A photonic integrated circuit (PIC) includes a semiconductor substrate, one or more passive components, and one or more active components. The one or more passive components are fabricated on the semiconductor substrate, wherein the passive components are fabricated in a III-V type semiconductor layer. The one or more active components are fabricated on top of the one or more passive components, wherein optical signals are communicated between the one or more active components via the one or more passive components.

17 Claims, 10 Drawing Sheets

Related U.S. Application Data

(60) Provisional application No. 62/676,127, filed on May 24, 2018.

(51) Int. Cl.
*G02B 6/13* (2006.01)
*B82Y 20/00* (2011.01)

(56) References Cited

U.S. PATENT DOCUMENTS

| | | | |
|---|---|---|---|
| 7,633,988 | B2 | 12/2009 | Fish et al. |
| 7,829,880 | B2 | 11/2010 | Ebe et al. |
| 9,960,567 | B2* | 5/2018 | Kim ................. H01S 5/1209 |
| 11,435,524 | B2* | 9/2022 | Bowers ............. H01S 5/0264 |
| 2004/0168626 | A1 | 9/2004 | Moeck et al. |

OTHER PUBLICATIONS

"International Search Report and Written Opinion received in Application No. PCT/US2019/033990, dated Aug. 9, 2019", 14 pages.
Adachi, "Handbook on Physical Properties of Semiconductors", Kluwer Academic Publishers, vol. 2, 2004.
Akca, et al., "Electro-Optic and Electro-Absorption Characterization of InAs Quantum Dot Waveguides", Optics Express, vol. 16, No. 5, Mar. 3, 2008, pp. 3439-3444.
Akiyama, et al., "An Ultrawide-Band Semiconductor Optical Amplifier Having an Extremely High Penalty-Free Output Power of 23 dBm Achieved with Quantum Dots", IEEE Photonics Technology Letters, vol. 17, No. 8, Aug. 2005, pp. 1614-1616.
Akiyama, et al., "Quantum-Dot Semiconductor Optical Amplifiers", Proceedings of the IEEE, vol. 95, 2007, pp. 1757-1766.
Alferov, et al., "Double Heterostructure Laser", Authors Certificate No. 27448, Application No. 950840, Mar. 30, 1963.
Alferov, et al., "Investigation of the Influence of the AlAs—GaAs Heterostructure Parameters on the Laser Threshold Current and the Realization of Continuous Emission at Room Temperature", Soviet Physics: Semiconductors, vol. 4, Issue 9, 1971, pp. 1573-1575.
Arakawa, et al., "Multidimensional Quantum Well Laser and Temperature Dependence of Its Threshold Current", Applied Physics Letters, vol. 40, No. 11, Jun. 1, 1982, pp. 939-941.
Arsenijevi, et al., "Quantum-Dot Mode-Locked Lasers for Microwave-Signal Generation and 160 GB/s Optical Communication", IEEE Photonics Conference (IPC), 2015, pp. 635-636.
Arsenijevi, et al., "Quantum-Dot Mode-Locked Lasers: Sources for Tunable Optical and Electrical Pulse Combs", Green Photonics and Electronics, 2017, pp. 75-106.
Bauters, et al., "Planar Waveguides with Less than 0.1 dB/m Propagation Loss Fabricated with Wafer Bonding", Optics Express, vol. 19, No. 24, Nov. 10, 2011, pp. 24090-24101.
Bauters, et al., "Silicon on Ultra-Low-Loss Waveguide Photonic Integration Platform", Optics Express, vol. 21, No. 1, Jan. 14, 2013, pp. 544-555.
Bayer, et al., "Temperature Dependence of the Exciton Homogeneous Linewidth in In0.60Ga0.40As/GaAs Selfassembled Quantum Dots", Physical Review, vol. 65, Jan. 2002.
Beling, et al., "Heterogeneously Integrated Photodiodes on Silicon", IEEE Journal of Quantum Electronics, vol. 51, No. 11, Nov. 2015, pp. 1-6.
Bhasker, et al., "Intensity and Phase Modulators in Epitaxial III-V Layers Directly Grown on Silicon Operating at 1.55 μm", Frontiers in Optics, 2017, 2 pages.
Bhattacharya, et al., "High-Speed 1.3 μm Tunnel Injection Quantum-Dot Lasers", Applied Physics Letters, vol. 86, 2005, pp. 153109-1-153109-3.
Bhattacharya, et al., "Room-Temperature Self-Organized In0.5Ga0.5As Quantum Dot Laser on Silicon", Electronics Letters, vol. 41, No. 13, Jun. 23, 2005, 2 pages.
Bhowmick, et al., "High Performance InAs/In0.53Ga0.23Al0.24As/InP Quantum Dot 1.55 um Tunnel Injection Laser", IEEE Journal of Quantum Electronics, vol. 50, No. 1, Jan. 1, 2014, 8 pages.
Bimberg, et al., "Quantum Dots: Promises and Accomplishments", Materials Today vol. 14, No. 9, Sep. 2011, pp. 388-397.
Borri, et al., "Ultrafast Carrier Dynamics in InGaAs Quantum Dot Materials and Devices", Journal of Optics A Pure and Applied Optics, vol. 8, 2006, pp. S33-S46.
Bowers, et al., "A Comparison of Four Approaches to Photonic Integration", Fiber Communications Conference (Optical Society of America, 2017), 2017, 3 pages.
Bowers, et al., "A Path to 300 mm Hybrid Silicon Photonic Integrated Circuits", Optical Society of America, 2013, 4 pages.
Camacho-Aguilera, et al., "An Electrically Pumped Germanium Laser", Optics Express, vol. 20, No. 10, May 2, 2012, pp. 11316-11320.
Castellano, et al., "Room-Temperature Continuous-Wave Operation in the Telecom Wavelength Range of GaSb-Based Lasers Monolithically Grown on Si", APLPhotonics, vol. 2, 2017, pp. 061301-1-061301-5.
Chen, et al., "Electrically Pumped Continuous-Wave 1.3 μM InAs/GaAs Quantum Dot Lasers Monolithically Grown on On-Axis Si (001) Subsirales", Optics Express vol. 25, No. 5, 2017, pp. 4632-4639.
Chen, et al., "Electrically Pumped Continuous-Wave III-V Quantum Dot Lasers on Silicon", Nature Photonics, vol. 10, Mar. 7, 2016, pp. 307-311.
Chow, et al., "On the Physics of Semiconductor Quantum Dots for Applications in Lasers and Quantum Optic", Progress in Quantum Electronics, vol. 37, Issue 3, Apr. 5, 2013, 117 pages.
Coldren, et al., "Diode Lasers and Photonic Integrated Circuits", JohnWiley & Sons, 2012.
Doldren, et al., "High Performance InP-Based Photonic ICs—A Tutorial", Journal of Lightwave Technology, vol. 29, No. 4, Feb. 15, 2011, pp. 554-569.
Courtland, "Intel Now Packs 100 Million Transistors in Each Square Millimeter", Retrieved via: https://spectrum.ieee.org/nanoclast/semiconductors/processors/intel-now-packs-100-million-transistors-in-each-square-millimeter, Mar. 30, 2017, 4 pages.
Dagens, et al., "Giant Linewidth Enhancement Factor and Purely Frequency Modulated Emission from Quantum Dot Laser", Electronics Letters, vol. 41, No. 6, Mar. 17, 2005, 3 pages.
Del Alamo, "Nanometre-Scale Electronics with III-V Compound Semiconductors", Macmillan Publishers Limited. All rights reserved, Nov. 17, 2011, pp. 317-323.
Ding, et al., "Modulation Bandwidth and Energy Efficiency of Metallic Cavity Semiconductor Nanolasers with Inclusion of Noise Effects", Laser & Photonics Reviews, vol. 9, No. 5, Sep. 2015, pp. 488-497.
Doerr, et al., "O, E, S, C, and L Band Silicon Photonics Coherent Modulator/Receive", Optical Fiber Communication Conference (Optical Society of America, 2016), paper Th5C.4, 2016.
Doerr, "Silicon Photonic Integration in Telecommunications", Frontiers in Physics, vol. 3, Article 37, Aug. 2015, 16 pages.
Duan, et al., "Silicon Quantum Dot Lasers with Long Delay Optical Feedback", International Symposium on Physics and Applications of Laser Dynamics, 2018.
Elshaari, et al., "On-Chip Single Photon Filtering and Multiplexing in Hybrid Quantum Photonic Circuits", Nature Communications, vol. 8, No. 379, 2017, 8 pages.
Fang, et al., "Electrically Pumped Hybrid AlGaInAs-Silicon Evanescent Laser", Optics Express, vol. 14, No. 20, Oct. 2, 2006, pp. 9203-9210.
Feng, et al., "Epitaxial III-V-on-Silicon Waveguide Butt-Coupled Photodetector", Optics Letters vol. 37, No. 19, Oct. 1, 2012, pp. 4035-4037.
Fischer, et al., "GaAs Bipolar Transistors Grown on (100) Si Substrates by Molecular Beam Epitaxy", Applied Physics Letters, vol. 47, No. 4, Aug. 15, 1985, pp. 397-399.
Geng, et al., "High-Speed InGaAs Photodetectors by Selective-Area MOCVD Toward Optoelectronic Integrated Circuits", IEEE Journal of Selected Topics in Quantum Electronics, vol. 20, No. 6, 2014, pp. 36-42.

(56) References Cited

OTHER PUBLICATIONS

George, et al., "Dislocation filters in GaAs on Si", Semiconductor Science and Technology, vol. 30, 2015, 7 pages.

Gonda, et al., "Proton Radiation Effects in Quantum Dot Lasers", Applied Surface Science, vol. 255, 2008, pp. 676-678.

Grillot, et al., "Gain Compression and Above-Threshold Linewidth Enhancement Factor in 1.3-InAs—GaAs Quantum-Dot Lasers", IEEE Journal of Quantum Electronics, vol. 44, No. 10, Oct. 10, 2008, pp. 946-951.

Groenert, et al., "Improved Room-Temperature Continuous Wave GaAs/AlGaAsand InGaAs/GaAs/AlGaAs Lasers Fabricated on Si Substrates via Relaxed Graded Buffer Layers", Journal of Vacuum Science & Technology B, vol. 21, No. 3, May/Jun. 2003, pp. 1064-1069.

Gruetzmacher, et al., "Three-Dimensional Si/Ge Quantum Dot Crystals", Nano Letters, vol. 7, No. 10, 2007, pp. 3150-3156.

Heck, et al., "Energy Efficient and Energy Proportional Optical Interconnects for Multi-Core Processors: Driving the Need for On-Chip Sources", IEEE Journal of Selected Topics in Quantum Electronics, vol. 20, No. 4, 2014, pp. 1-12.

Herrick, et al., "Reliability of Quantum Well and Quantum Dot Lasers for Silicon Photonics", Invited Paper at the International Photonics Conference, IEEE, 2017.

Huang, et al., "InGaAs/GaAs Quantum Well Lasers Grown on Exact GaP/Si (001)", Electronics Letters, vol. 50, 2014, pp. 1226-1227.

\* cited by examiner

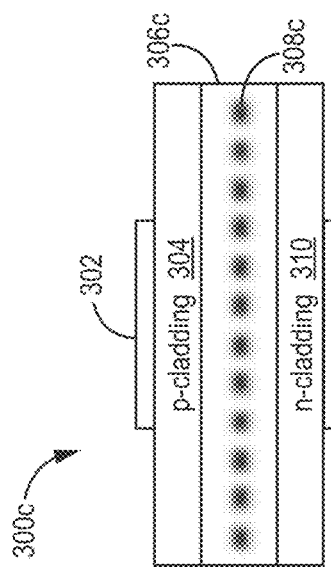
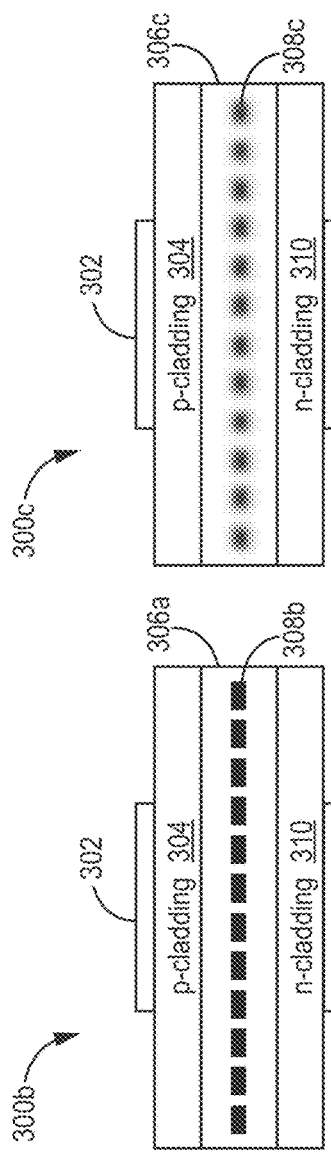
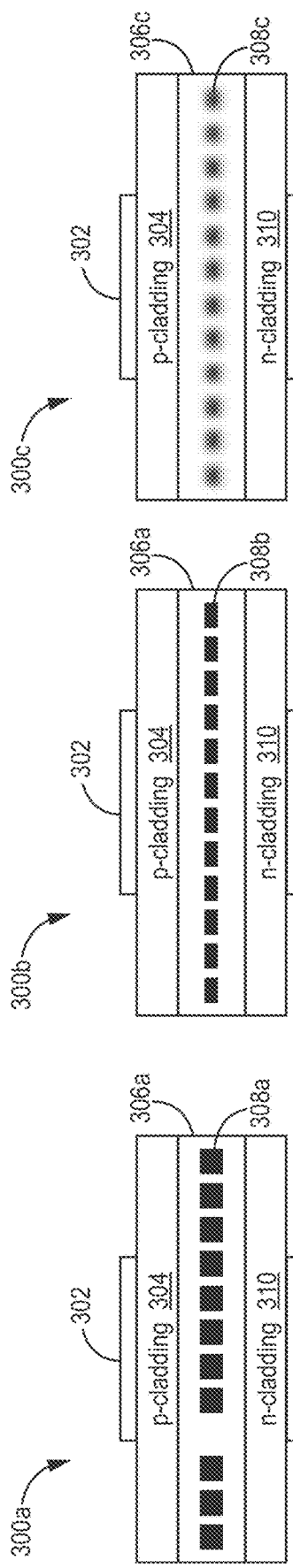
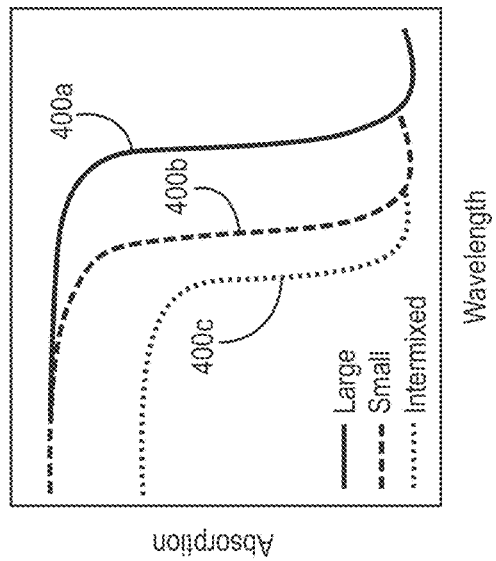

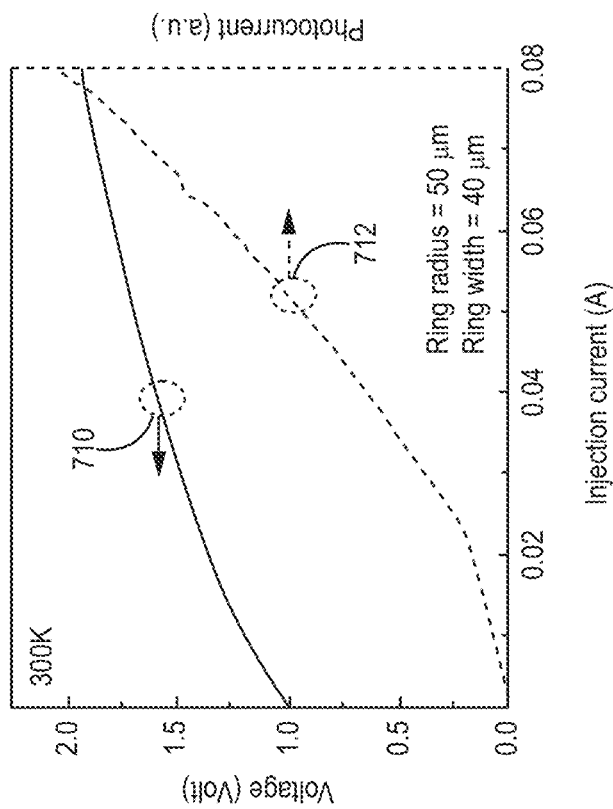
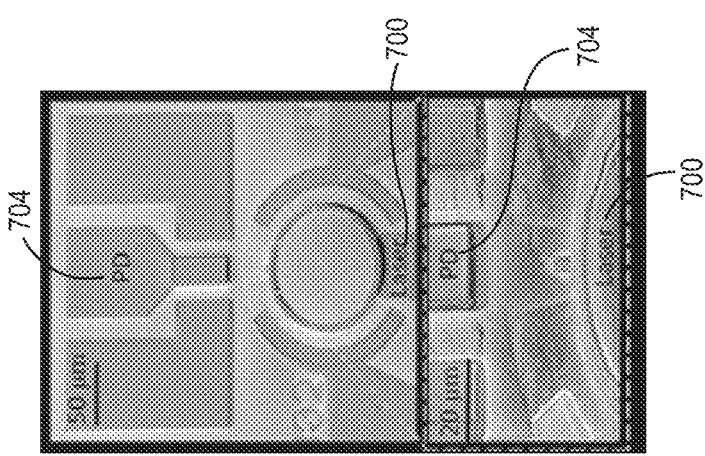
FIG. 7B
FIG. 7A

MONOLITHIC INTEGRATED QUANTUM DOT PHOTONIC INTEGRATED CIRCUITS

CROSS-REFERENCE TO RELATED APPLICATIONS

This application is a Continuation of U.S. application Ser. No. 17/058,057 filed Nov. 23, 2020, which is a National Stage Application of PCT/US2019/033990, filed on May 24, 2019, which claims the benefit of U.S. Provisional Application No. 62/676,127 filed on May 24, 2018, and which applications are incorporated herein by reference. A claim of priority is made.

STATEMENT OF GOVERNMENT LICENSE RIGHTS

This invention was made with Government support under Grant No. DE-AR0000672, awarded by the U.S. Department of Energy. The Government has certain rights in this invention.

TECHNICAL FIELD

This invention relates generally to photonic integrated circuits, and in particular to photonic integrated circuits utilizing quantum dots.

BACKGROUND

Photonic integrated circuits are the optical analogs of integrated microelectronic circuits. A typical PIC consists of a III-V laser light source that provides an optical output, and one or more additional components such as modulators and detectors that impart some functionality. Typical applications of PICs are for optical data generation and transmission for fiber and free space communications, sensing, and high-performance computing. Current PIC devices universally utilize quantum well-based technologies which have limited energy efficiency, scalability and thus integration density, reliability, stability, and performance under harsh conditions such as at elevated temperatures as encountered in datacenter and high-performance computing environments.

SUMMARY

According to some embodiments, a monolithic photonic integrated circuit (PIC) includes a semiconductor substrate and III-V type semiconductor layers located vertically adjacent to the semiconductor substrate. One or more passive components are fabricated in a portion of the III-V type semiconductor layers. A first active component located adjacent the one or more passive components is fabricated in at least a portion of the III-V type semiconductor layer, the first active component having one or more active layers comprised of first quantum dots (QDs). A second active component located adjacent the one or more passive components is also fabricated in at least a portion of the III-V type semiconductor layer, the second active component having one or more active layers comprised of second quantum dots (QDs), wherein optical signals are communicated by the one or more passive components from the first active component to the second active component to provide a monolithic PIC on the semiconductor substrate.

According to some embodiments, a method of fabricating a monolithically integrated photonic integrated circuit (PIC) includes epitaxially depositing III-V semiconductor layers on a semiconductor substrate and processing the III-V semiconductor layers to fabricate passive components and two or more active components comprised of active regions that include quantum dot (QD) layers. The active components are optically coupled to one another via the passive components.

According to some embodiments, a method of fabricating a monolithically integrated photonic integrated circuit (PIC) includes epitaxially depositing first III-V semiconductor layers on a semiconductor substrate. The method further includes processing the first III-V semiconductor layers to form a passive optical component and epitaxially depositing second III-V semiconductor layers on top of the first III-V semiconductor layers. The method further includes processing the second III-V semiconductor layers to form at least first and second active optical components, wherein processing of the second III-V semiconductor layers includes fabricating one or more layers of quantum dots (QD) separated by one or more barrier layers.

BRIEF DESCRIPTION OF THE DRAWINGS

FIGS. 3a-3c are cross-sectional views of QD modulators according to various embodiments.

FIG. 4 is a graph illustrating the ability to shift the band gap of the QDs as a result of quantum dot size and intermixing as shown in in FIGS. 3a-3c.

FIG. 7a is a top view of a quantum dot photonic integrated circuit that includes a QD ring laser, and a QD photodetector according to some embodiments; and FIG. 7b is a graph illustrating the relationship between injection current supplied to the QD laser and the photocurrent generated by the QD photodetector according to some embodiments.

DETAILED DESCRIPTION

According to embodiments disclosed herein, photonic integrated circuits (PIC) are fabricated from epitaxially deposited. III-V layers on a silicon substrate. The III-V layers are processed to fabricate both the active and passive components of the PIC. Quantum dots (QDs) are utilized in the active layers of the one or more active components including one or more of lasers, amplifiers, modulators, or photodetectors interconnected via waveguides where the QDs are responsible for the light generation, amplification, modulation, or detection respectively. Quantum dots can be defined as inclusions of narrow bandgap material within a wider bandgap material where the size of the inclusion is small enough that quantum mechanical discretization of the energy levels takes place. Such materials could be formed in general from various alloys within the III-V material system consisting of (In, Ga, Al)(As, P, Sb, N, Bi). Any combination of III-V materials or Group IV materials such as Si and Ge and their various dopants could be integrated in the device structure to facilitate electrical injection, carrier confinement, and optical waveguiding to the quantum dots. Potential methods of production for quantum dot photonic integrated circuits include but are not limited to molecular beam epitaxy, metal-organic chemical vapor deposition, and chemical beam epitaxy. Additional fabrication techniques could be utilized to differentiate the various components on chip (e.g. lasers, amplifiers, modulators, waveguides, detectors) including epitaxial regrowth and intermixing of the quantum dots to shift the bandgap to optimal energies. In this way, the present disclosure provides a PIC fabricated from epitaxially deposited III-V layers on silicon, wherein the III-V layers are utilized for both active devices as well as passive circuitry (e.g., waveguides, etc.).

Figure 1:
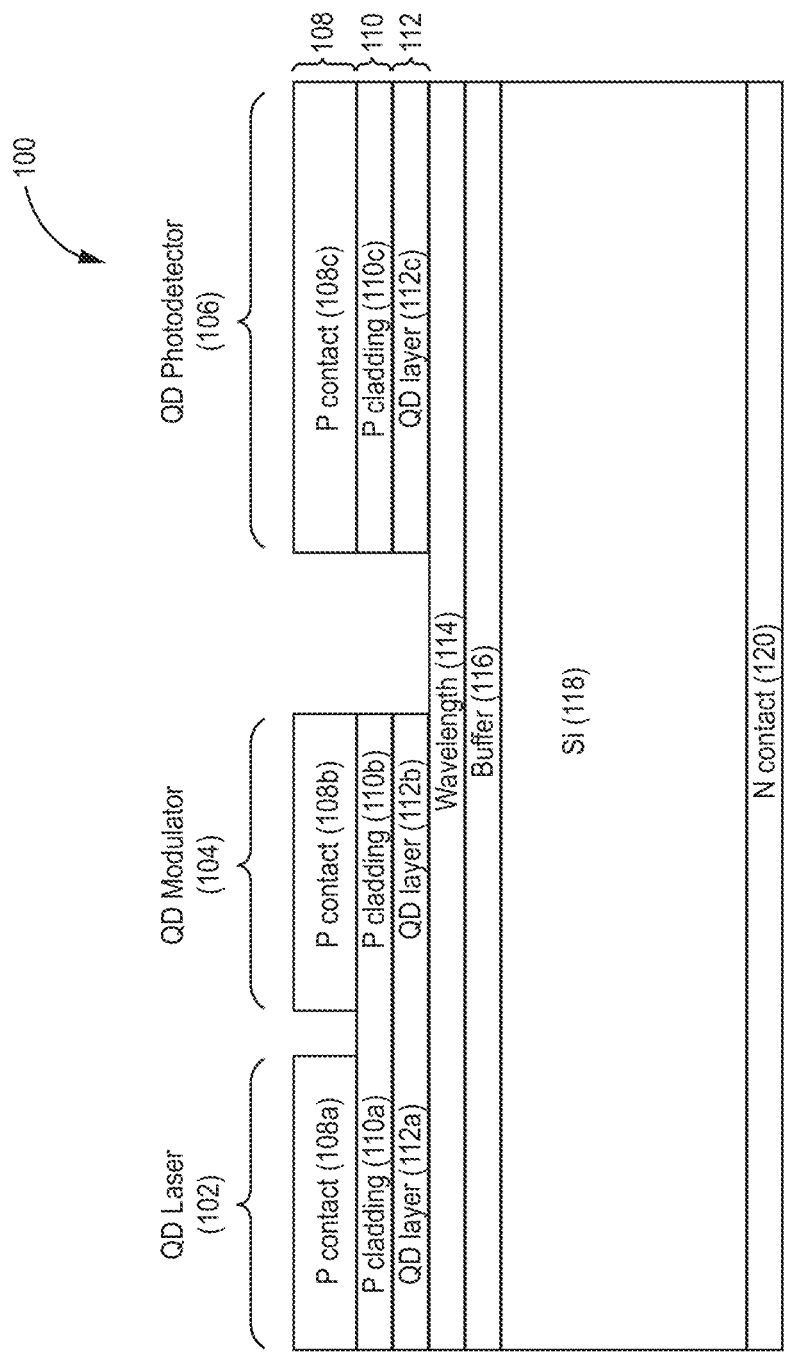
FIG. 1 is a simple cross-sectional view of a monolithic, quantum dot photonic integrated circuit that includes a quantum dot (QD) laser, QD modulator, and QD photodetector according to some embodiments.

FIG. 1 is a simple cross-sectional view of a quantum dot photonic integrated circuit 100 that includes a quantum dot (QD) laser 102, QD modulator 104, and QD photodetector 106 according to some embodiments. In the embodiment shown in FIG. 1, each of the QD laser 102, QD modulator 104, and QD photodetector 106 are comprised of type semiconductor layers epitaxially formed on a silicon substrate 118, with or without a buffer layer 116. In this embodiment waveguide 114 is fabricated from III-V semiconductor material and is located beneath the QD active layer 112 associated with the active components (e.g., QD laser 102, QD modulator 104, QD photodetector 106) to provide optical coupling between the plurality of active components. This configuration is referred to as "heteroepitaxial integration", as the III-V layers are epitaxially deposited on the silicon substrate to provide an integrated device. Although silicon is the most likely candidate to utilize as the substrate due to the cost-efficiency and reliability of silicon fabrication, in other embodiments other semiconductor materials may be utilized. However, the cost of type semiconductors makes them prohibitive.

In the embodiment shown in FIG. 1, III-V type layers epitaxially deposited on the silicon substrate 118 include a P-contact 108, P-cladding 110, QD layer 112, waveguide 114. For example, waveguide 114 is a passive component that is utilized by each of the QD laser 102, QD modulator 104 and QD photodetector 106. In this way, all functions are performed in the III-V epitaxial layers either through evanescent coupling to a waveguide layer, regrowth, or intermixing. Techniques for processing III-V type semiconductor materials—such as Indium Phosphide (InP)— are utilized to process both active and passive functions of the photonic integrated circuit. A benefit of this approach is that it eliminates the cost of III-V native substrate fabrication, relying on low-cost silicon substrates to facilitate scalable manufacturing. As a result, all of the advantages associated with utilizing III-V devices are realized, while eliminating the cost of the native III-V substrate and improving the thermal impedance of devices due to the higher thermal conductivity of silicon as compared to type III-V semiconductors.

In some embodiments, one or more of the QD laser 102, the QD modulator 104, and the QD photodetector 106 utilize quantum dots as the active medium. In solid-state materials, a quantum dot (QD) is a small, three-dimensional inclusion of a narrower bandgap material within a wider bandgap matrix. At quantum length scales, the 3D confinement potential of the inclusion leads to discrete energy levels analogous to the textbook case of a particle-in-a-box. The discretization leads to localized, atom-like properties with size and confinement dependent energy levels. For optoelectronic applications, the most well-developed QD material system is In(Ga)As within either a matrix of (In, Al, Ga) As materials or in a matrix of (In, Al, Ga)(As, P) materials targeting the InP lattice constant. The importance of distinguishing these two materials systems derives from the mechanism of QD formation during crystal growth. In some embodiments, quantum dots are fabricated using the Stranski-Krastanov growth mode. In this growth mode, surface energetics initially favor a planar growth of the QD material, but with increasing thickness, the surface energy is counterbalanced by building strain energy from the mismatched lattice constants. The strain energy ultimately drives the re-organization of the QD material into 3D islands allowing for more efficient strain relaxation. Other methods of QD formation include sub-monolayer deposition, droplet epitaxy, surface patterning, the Volmer-Weber growth mode for materials whose surface energetics favor islanding, and through growth of thin layers of material within nanowires. Using these techniques, QDs have been formed using material combinations throughout the III-V and IV material system.

Due to the self-assembled nature of QD growth, the ultimate properties of the material are highly dependent on kinetic restraints during growth. Properties such as the areal QD density, size, homogeneity, ground state transition energy, energy level separation, and number of confined states can all be tuned to some degree and optimized for a target application by changing growth temperature, growth rate, V/III ratio, and sequences (e.g., growth interrupts or capping procedure). This fine tuning is on top of the tunability achieved by changing the composition of the QDs themselves and the surrounding cladding material.

As discussed in more detail below, QD laser 102 operates via application of an injection current provided via p-contact 108a, which results in QD laser 102 generating a desired optical output within the respective QD layer 112a of QD laser 102. The QD layer 112a of QD laser 102 is coupled to the QD layer 11M of QD modulator 104 via waveguide 114, In some embodiments, an electrical signal applied to p-contact 108b acts to selectively modulate the optical signal within the QD layer 112b of QD modulator 104. In some embodiments, QD modulator 104 is an electro-absorptive modulator that modulates the intensity of the optical signal via the application of an electric voltage provided to p-contact 108b, causing light to either be absorbed or transmitted through the optical cavity of the QD modulator. In other embodiments, QD modulator 104 is a refractive modulator that modulates the phase of the optical signal. The modulated optical output is provided to QD photodetector 106 via waveguide 114. The QD layer 112c of the QD photodetector 106 converts the optical signal to an electrical signal that is provided at p-contact 108c. For each device, the n-contact could be on the silicon as in 120 or placed somewhere in layers 114, 116, or 118 for top-side contacts. In this way, PIC 100 provide a plurality of active devices integrated onto a single integrated circuit. In addition, heteroepitaxial integration of MA' materials on a silicon substrate provides a cost-effective way of manufacturing photonic integrated circuits.

In some embodiments, waveguide 114 and QD layer 112 are fabricated from the same layer. In this embodiment, the portion corresponding to waveguide 114 may be fabricated with the bandgap shifted to higher energies to accommodate lower losses in the waveguide 114.

With respect to QD laser 102, utilization of quantum dots provides for a number of benefits over traditional bulk semiconductor lasers and/or quantum well lasers. In particular, the discrete density of states provided by QD lasers results in lower thresholds, higher temperature operation, and higher characteristic temperature, To, as compared with quantum well (QW) lasers. In particular, as the density of states is further discretized, the sub-bands collapse into delta-function like energy levels with atom-like degeneracy, meaning that for the case of a quantum dot in the ground state, there is a maximum occupancy of two electrons, as dictated by the Pauli exclusion principle. Relative to higher dimensional structures, this means that there will be less Fermi level pinning at the band edge, and thus, it will be easier to achieve population inversion. Population inversion is a necessary criterion to the onset of lasing as it sets the transparency condition where stimulated emission exactly cancels stimulated absorption. The transparency current can be thought of as the current necessary to achieve lasing in an idealized, lossless laser cavity. As such, it represents a floor on the lowest achievable threshold current limiting the achievable energy efficiency of a laser.

In some embodiments, energy efficiency of QD laser 102 is improved over traditional lasers (e.g., bulk III-V lasers and quantum well (QW) lasers) as a result of reduced sensitivity to sidewall recombination. In particular, each QD effectively acts as a trap for charge carriers moving in plane, which effectively reduces the in-plane diffusion length. For example, in some embodiments the ambipolar diffusion length in QD lasers has found that it can be less than 1 µm but is dependent on the injection level, rising to a maximum of 1.5 µm, due to the weaker confinement in the excited states of the QD. In contrast, typical diffusion lengths in QWs are in the range of several microns, so by switching to a QD active region, devices can be fabricated at smaller scales to achieve lower threshold currents and better energy efficiency.

In some embodiments, QD laser 102 also provides high temperature performance as a result of the inability of the carrier population to thermally broaden into higher states. For example, with respect to Indium Arsenide (InAs) QDs, the typical separation between the ground state and first excited state within the conduction band is 70 meV or higher, which exceeds kT at room temperature. In particular, utilization of quantum dots (QD) allows QD laser 102 to sustain lasing at higher absolute temperatures and further increases the characteristic temperature $T_0$, which is a measure of how much the threshold current $I_{th}$ of a laser changes with changes in temperature. High $T_0$ leads to less threshold increase with temperature which simplifies device operation in fluctuating temperature environments such as those in datacenters.

QD laser 102 also provides for a linewidth enhancement factors (LEF) that is near zero. The linewidth enhancement factor (LEF) describes the ratio of changes in the real part of the complex refractive index, $\tilde{n}=n+jni$, to changes in the imaginary part, $$\alpha = -\frac{dn/dN}{dn_i/dN};$$  Eq. 1

Smaller values of the LEF result in narrower laser linewidths, higher feedback tolerance, and higher output powers. With respect to quantum well lasers, LEF from 4 to 6 have been shown. In contrast, utilizing quantum dots allows for LEFs less than 4 in some embodiments, and less than 0.25 in some embodiments.

The connection between the LEF and the laser linewidth can be expressed by the following equation:

$$\Delta v = \frac{(\Gamma g_{th} v_g)^2 \eta_0}{4\pi P_0} h v n_{sp}(1 + \alpha^2),$$  Eq. 2 where $\Gamma g_t h$ is the threshold modal gain, $v_g$ is the group velocity, $\eta_0$ is the single facet optical efficiency, Po is the output power, hv is the photon energy, and nsp is the population inversion factor. From this equation, the linewidth scales with $(1+a^2)$, meaning that even a small reduction in the absolute value of the LEF will lead to significant reductions in laser linewidth. Furthermore, QD lasers could also have higher output powers yielding additional linewidth improvement.

The possibility of higher output powers in QD lasers is a result of their resistance to filamentation. Filamentation is a phenomenon in lasers with positive LEFs and high output powers where the optical mode will begin to deplete carriers in the central region of the waveguide, which in turn causes a local increase in the refractive index resulting in self-focusing of the laser beam leading to further carrier depletion and more intense focusing. Filamentation establishes an upper limit on increasing a laser's output power by increasing its width. The lower LEF of QD lasers is an indication that the local changes in refractive index should be smaller and thus lead to lower filamentation. In some embodiments, QD lasers may provide a negative LEF, in which case high output powers could be achieved. In some embodiments, QD lasers allow for reduced and/or completely suppressed filamentation.

Finally, the advantages of a low LEF also extend to feedback susceptibility and noise. In any integrated photonic system such as that shown in FIG. 1, and particularly in those using low loss waveguides, undesired reflections will be generated and fed back into the laser cavity. Such feedback can have a destabilizing effect, inducing multi-mode operation or even total coherence collapse depending on the strength of the feedback relative to a critical level, which can be defined by the following equation:

$$f_{crit} = \frac{\tau_L^2 (Kf_r^2 + \gamma_0)^2}{16|C_e|^2}\left(\frac{1+\alpha^2}{\alpha^4}\right),$$

wherein $\tau_L$ is the roundtrip cavity delay, $(Kf_r^2+\gamma_0)$ is the damping rate defined by the K-factor and damping offset, $\gamma_0$, $f_r$ is the relaxation oscillation resonance frequency, and $$|C_e| = \frac{1-R}{2\sqrt{R}}$$

is the cavity coupling strength. In some embodiments, QD lasers provide high damping rates (as compared with QW lasers) due to the larger K values associated with QD lasers. For example, in some embodiments, QD lasers may exhibit a K value of greater than one nanosecond while QW lasers typically exhibit K values less than one nanonsecond. In some embodiments, QD lasers provide higher thresholds for coherence collapse than QW lasers. In addition to coherence collapse, QD lasers provide improved sensitivity as compared with QW lasers. For example, in some embodiments the QD lasers show a 15-20 dB lower sensitivity than QW lasers.

Figure 2B:
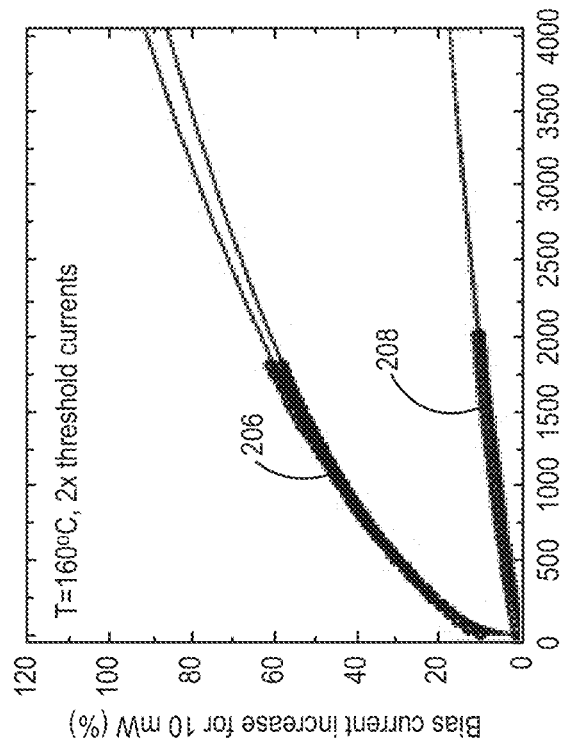
FIG. 2b is a graph illustrating performance of QD laser shown in FIG. 2a as compared with a QD laser that does not include p-doped regions located between the quantum dot layers.
Figure 2A:
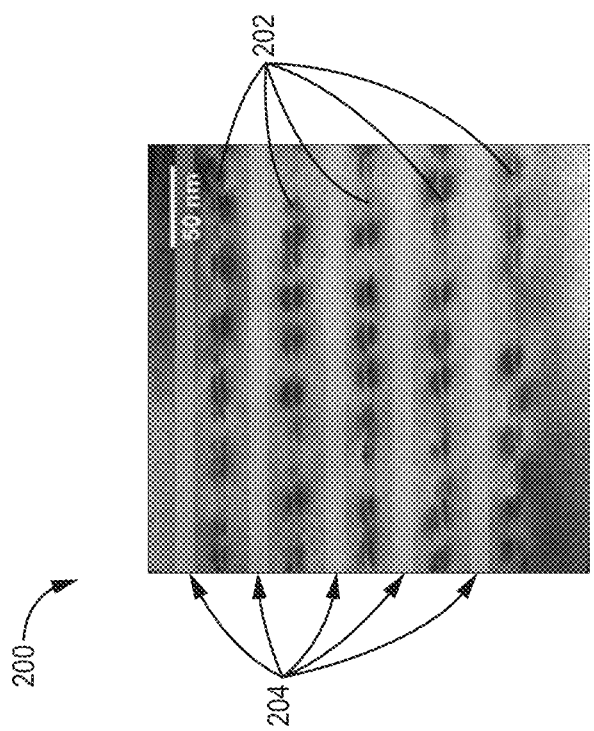
FIG. 2a is a transmission electron microscope (TEM) cross-sectional view of an active region of a quantum dot laser according to some embodiments.

FIG. 2a is a cross-sectional view of the active region 200 of a QD laser according to some embodiments, in which a plurality of layers of quantum dots 202 are separated by p-doped regions 204. In some embodiments, the addition of p-doped regions 204 between the plurality of layers of quantum dots 202 increases the gain of the QD laser—for example QD laser 102 shown in FIG. 1. In addition to increased gain, utilization of p-doped regions 204 vastly improves the lifetime of the laser operating at elevated temperatures (e.g., 60° C.), as shown in FIG. 2b. In some embodiments, the p-doped region utilizes Beryllium (Be) as the dopant. In other embodiments, other types of dopants may be utilized to provide the p-doped regions 204 between the plurality of layers of quantum dots 202, such as carbon.

FIG. 2b is a graph that illustrates the aging performance of the p-doped QD laser shown in FIG. 2a as compared with unintentionally or undoped QD lasers. The x-axis illustrates aging in hours (out to approximately 4,000 hours) and the y-axis illustrates bias current increase from an initial value to generate 10 milliwatts (mW) of power. The QD laser with p-doped regions 204 is illustrated by line 208, while the QM laser that does not utilize p-doped regions is illustrated by line 206. Both initially require a threshold current to initiate lasing at a desired output of 10 mW. Over time, degradation of the laser requires the injection current to be increased to maintain the desired output. As shown by the dots associated with line 206, after approximately 1,570 hours of use, the undoped QD laser requires an injection current increase over the initial current of approximately 60%. Extrapolation of the monitored performance to 4,000 hours, the undoped QD laser requires an injection current increase of approximately 85-90%. In contrast, continuous operation of the p-doped QD laser for 2,000 hours requires an increase in injection current over the initial injection current of approximately 10%. Extrapolated out to 4,000 hours, the p-doped QD laser requires an increase in injection current of less than 20%. In this way, the inclusion of intentionally p-doped regions between the layers of quantum dots drastically improves the expected lifetime of the QD laser. In particular, the ability to provide a QD laser that is reliable over an extended period of time (e.g., 4,000 hours) provides economic feasibility to integrating a QD laser on a photonic integrated circuit (PIC). In the event the laser fails to operate, the entire PIC must be discarded, so the reliability and longevity of the QD laser is an important aspect to utilizing an integrated PIC in real-world applications.

In addition to providing a number of benefits associated with conventional continuous-wave lasers, QD active regions also provide a number of benefits to mode-locked lasers (MLLs). The aspects of the discrete density of states that lead to lower thresholds, higher powers, and higher temperature operation described with respect to continuous-wave lasers will all benefit MLLs in the same manner. In addition, the carrier dynamics of QD gain media provide a number of benefits over QW gain media because the carrier density in the QD active states is low due to the atom-like nature of the QDs while the carrier density in the separate-confinement heterostructure (SCH) outside the dots is orders of magnitude higher at operating biases. This separation of the carrier density in energy space decouples the gain recovery in QDs from the much slower reservoir repopulation and allows for gain recovery on the picosecond or even femtosecond time scales. This allows the gain and absorber recovery times of QD MLLs to be ultrashort. For example, in some embodiments, QD MLLs have pulsewidths less than a picosecond (ps). In addition, the lower LEF results in less chirping and shorter pulses. Relative to QW lasers, QD lasers also provide reduced amplified spontaneous emission, which leads to reduced jitter in MLLs. Furthermore the engineerable, broad gain spectra of QD gain media can allow for generation of a broad frequency comb for dense wavelength division multiplexing (DWDM) applications. The independent nature of each QD from each other reduces mode partition noise relative to QW MLLs. In some embodiments, spontaneous mode locking without separate active and/or passive mode locking sections may be provided.

In addition to utilizing QD lasers, QD active regions such as those shown in FIGS. 1 and 2a may be utilized in semiconductor optical amplifiers (SOA). Utilizing QD active regions in SOAs provides a number of benefits over traditional QW SOAs. In general, QD SOAs operate in much the same way as QD lasers, except instead of utilizing reflections to encourage lasing, QD SOAs utilize anti-reflective coatings or cavity designs to prevent reflections within the cavity and thereby prevent lasing within the cavity. However, the improvements noted above with respect to QD lasers apply—at least generally—to QD SOAs.

In some embodiments, the reduced filamentation associated with QD active regions provides for higher gains. In addition, the QD active regions provide for simultaneous multi-channel amplification, and nonlinear effects. In addition, the inhomogeneous broadening due to QD size fluctuations can be tuned to achieve large gain bandwidths. For example, in some embodiments, bandwidths may operate in the E-, S-, O-, and C-bands.

In particular, the carrier dynamics of QD gain media provide a number of benefits over QW gain media because the carrier density in the QD active states is low due to the atom-like nature of the QDs while the carrier density in the separate-confinement heterostructure (SCH) outside the dots is orders of magnitude higher at operating biases. This separation of the carrier density in energy space decouples the gain recovery in QDs from the much slower reservoir repopulation and allows for gain recovery on the picosecond or even femtosecond time scales. In contrast, in QW active regions the carrier reservoir and the gain peak overlap leading typically nanosecond time scales for gain recovery due to the slow process of carrier injection. The decoupling between gain and reservoir carrier densities means that the refractive index can be modulated through direct modulation of the SOA without affecting the amplitude of amplification. For example, this allows for the design of efficient, compact optical networks built on differential-phase-shift keying (DPSK).

Furthermore, the independent nature of individual QDs means that the amplification by dots of different transition energies will not be coupled. In QWs, the phenomenon of cross-gain modulation (XGM) is well documented and results from amplification at one wavelength depleting carriers and reducing the amplification at a separate wavelength. In a QD gain medium, simultaneous amplification of multiple signals can be obtained because dots that are resonant with one wavelength will not be resonant with the additional amplified wavelengths to within the limits of the homogeneous broadening of individual dot transitions. For example, this allows for the simultaneous amplification of a number of wavelength channels (e.g., four) while maintaining a low optical signal-to-noise ratio.

As discussed above, QD modulators (such as QD modulator 104 shown in FIG. 1) are utilized to selectively modulate light generated by the QD laser. In particular, the high quantum confinement of QDs allows for excitonic behavior at and above room temperature which provides a path to low internal loss and large absorption modulation. That is, the discrete energy states of quantum dots can be utilized to create a device that provides maximum extinction ratio for small changes in electrical field applied to the p-doped contact of the QD modulator, such that an optical input provided to QD modulator 104 may be selectively modulated. In addition, it is beneficial if the electrical field required is (e.g., the modulation voltage) is small. In some embodiments, to minimize absorption loss, the modulator material is band-shifted to higher energies through one or more of quantum well intermixing, regrowth of a separate, higher bandgap material stack, or growth on a patterned surface.

For example, FIGS. 3a-3c are cross-sectional views of QD modulators utilizing different size quantum dots (e.g., large and small) as well as QDintermixing, respectively. For example, QD modulator 300a shown in FIG. 3a includes a p-doped contact region 302, a p-cladding layer 304, an active region 306a comprised of one or more layers of relatively large quantum dots 308a, n-cladding layer 310 and n-contact 312. The QD modulator 300b shown in FIG. 3b includes a p-doped contact region 302, a p-cladding layer 304, an active region 306b comprised of one or more layers of relatively small quantum dots 308b (e.g. smaller in size than large quantum dots 308b), n-cladding layer 310, and n-contact 312. The QD modulator 300c shown in FIG. 3c includes a p-doped contact region 302, p-cladding layer 304, active region 306c, and intermixed quantum dots 308c, n-cladding region 310, and n-contact 312. Intermixing quantum dots—as shown in FIG. 3c— band shifts the modulator material to higher energies. In some embodiments, QD intermixing is provided by inducing point defects or lattice damage that enhances interdiffusion between layers of materials, which results in mixing of the atomic composition of the layers. For example, in some embodiments the quantum dot composition (e.g., indium-arsenide (InAs)) mixes with the surrounding barrier layer compositions (e.g., indium-gallium-arsenide (InGaAs), gallium-arsenide (GaAs)), which changes the composition of the QD (e.g., decreases the indium (In) content and increases the gallium (Ga) content). In this embodiment, the resulting intermixed QD provides a wider bandgap and shorter wavelength absorption than the original composition. In some embodiments, intermixing benefits from each of the materials utilizing the same group V element (e.g., As) as that element can be selected as the bombarding ion species such that strain and band gap shifts are not introduced during recrystallization. In addition, intermixing provides the benefit or reducing strain within the intermixed layers.

FIG. 4 is a graph illustrating the comparative performance of the QD modulators shown in FIGS. 3a-3c, as illustrated by lines 400, 402, and 404 respectively. For QD modulators, it is desirable to provide an absorption profile having a relatively sharp band edge that is at higher energy than the incident light to yield low loss in the transmitting state. As shown in FIG. 4, the small quantum dots associated with QD modulator 300b shifts the absorption profile to higher energies (shorter wavelength) as compared to the large quantum dots associated with QD modulator 300a. Intermixing quantum dots as provided in QD modulator 300c results in tunable shifting of the absorption profile to higher energies than may be achievable at desired growth conditions, albeit with a lower maximum absorption.

Figure 5:
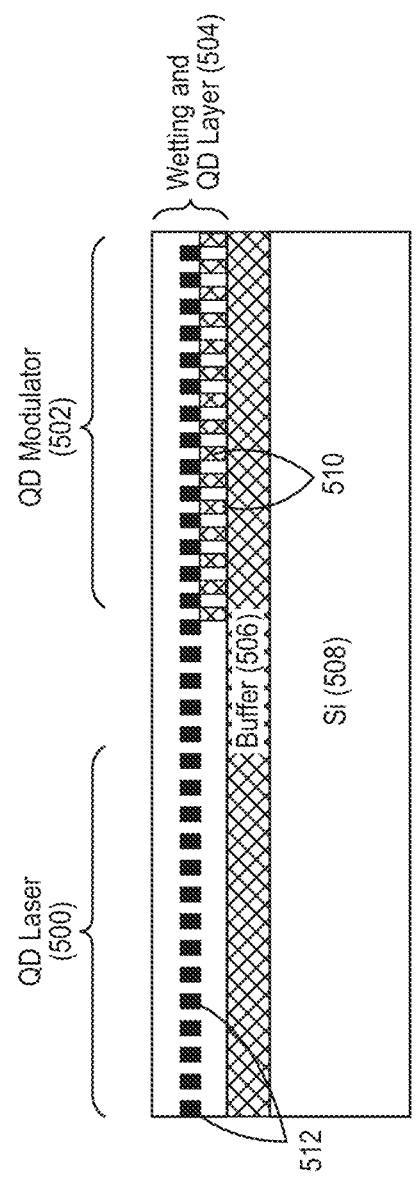
FIG. 5 is a cross-sectional view of a QD modulator according to another embodiment of the present invention.

FIG. 5 is a cross-sectional view of QD laser 500 and QD modulator 502 according to some embodiments. In this embodiment, QD laser 500 and QD modulator 502 are epitaxially deposited on a silicon substrate 508. With respect to the QD laser, the active layer 504 is once again comprised of a plurality of quantum dots 512, epitaxially deposited on the planar silicon substrate 508, or combination of silicon substrate 508 and buffer 506. However, in the area associated with QD modulator 502, the silicon layer 508 and/or buffer layer 506 is patterned. The addition of a grating/pattern associated with silicon layer 508 and/or buffer layer 506 promotes the growth of quantum dots of different sizes in the QD active region of the QD modulator. As compared with quantum dots formed on a planar surface, the quantum dots associated with the patterned section will be smaller, and therefore will promote a shift in the absorption edge of the QD modulator in much the same way described with respect to FIG. 4. In some embodiments, the pattern provided on the silicon substrate 508 and/or buffer layer 506 is relatively shallow (e.g., 10 nanometers (nm)) and relatively fine (e.g., spacing of approximately 70 nm). However, the depth and spacing of the pattern is dependent on the application and the desired properties associated with the QD modulator 502.

Although in the embodiment shown in FIG. 5, the patterning is provided with respect to the buffer layer 506, it should be understood that the patterning may be applied to the silicon layer 508 or be fabricated directly on top of the waveguide situated just below the quantum dots fabricated in the active region. The purpose being to use the patterning to change the dimension (size) of the quantum dots fabricated in the active region of the QD modulator. If the pattern is fabricated in the silicon layer, the epitaxial deposition of the subsequent layers will result in patterning of the layers located adjacent the quantum dots, and therefore will have the desired impact on the size of the quantum dots themselves.

In other embodiments, other means may be utilized to minimize absorption losses and band shift the QD modulator as desired. For example, in addition to intermixing quantum dots, and patterning one or more of the silicon substrate 508, buffer layer 506, or waveguide, in some embodiments the QD modulator material (e.g., active layer 504) is regrown with quantum dots that differ in size, composition, or surrounding material to increase the bandgap of the active layer of the QD modulator.

Figures 6A, 6B:
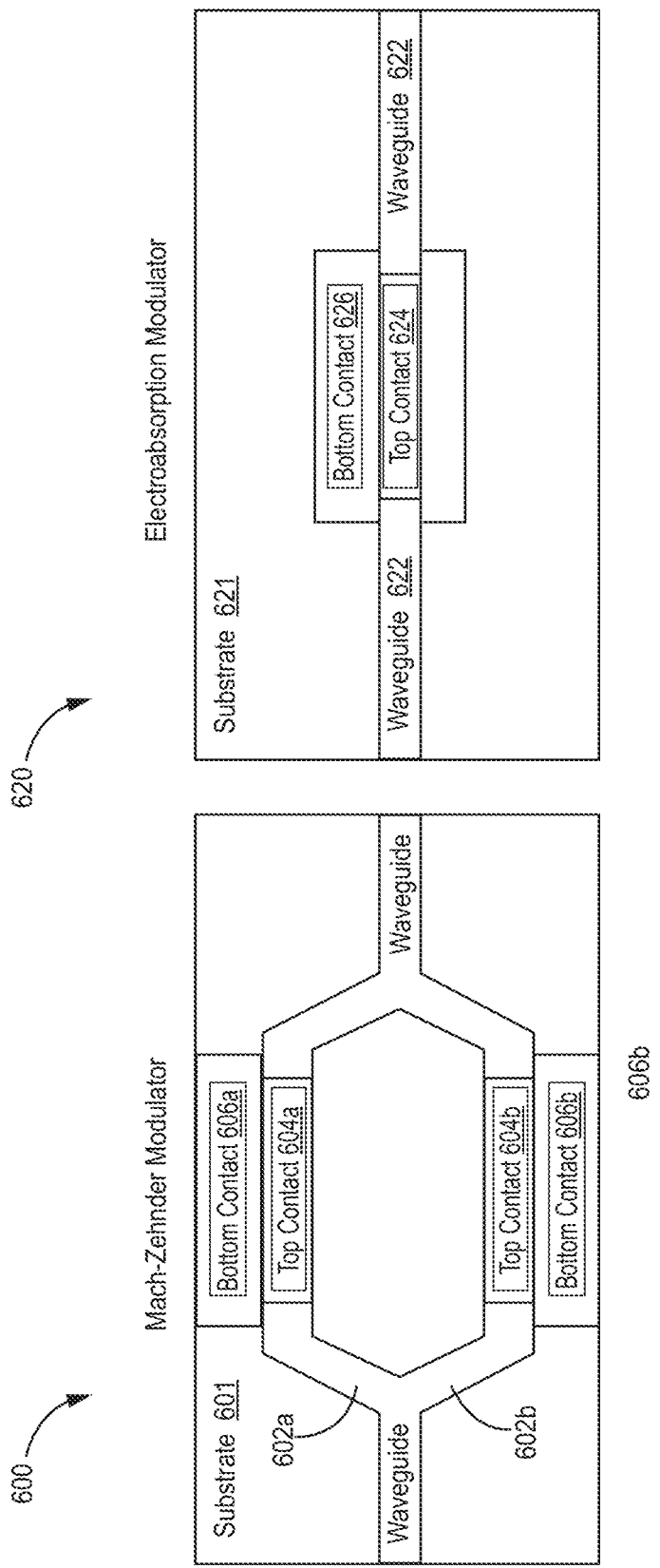
FIGS. 6a-6b are top views of QD modulators according to various embodiments.

FIGS. 6a and 6b are top views of two different types of QD modulators that may be utilized according to embodiments of the present invention. For example, FIG. 6a is a top view of a Mach-Zehnder modulator 600, and FIG. 6b is a top view of an electroabsorption modulator 620.

The Mach-Zehnder modulator 600 includes two waveguide interferometer arms 602a and 602b. Each waveguide interferometer arm 602a and 602b includes a top contact (e.g., p-doped contact) 604a and 604b, respectively, that allows a voltage to be selectively applied to the interferometer arms. A voltage applied to one of the interferometer arms (e.g., 602a) induces a phase shift for the optical signal passing through that arm. The optical signals in the waveguide interferometer arms 602a and 602b are recombined, and the phase shifts induced by the respective interferometer arms is converted to an amplitude modulation of the optical signal.

In contrast, the electroabsorption modulator 620 shown in FIG. 6b utilizes a single waveguide 622, wherein application of an applied electrical field via p-doped contact 624 causes a change in the absorption spectrum of the active layer of the modulator. In this way, light is either absorbed by the QD modulator or transmitted by the QD modulator based on the applied electric field.

As discussed above, QD photodetectors (such as QD photodetector 106 shown in FIG. 1) are utilized to generate an electrical current (i.e., photocurrent) in response to a received optical input. In some embodiments, QD photodetectors provide low dark currents and high temperature operation as a result of the high energy level separations within the quantum dots that suppress thermionic emissions.

FIG. 7a is a top view of a monolithic photonic integrated circuit (PIC) fabricated according to embodiments of the present invention. The PIC includes QD ring laser 700 and QD photodetector 704. FIG. 7b is a graph that illustrates the performance of QD photodetector 704, wherein line 710 is the voltage measured at the QD photodetector 704 and line 712 is the photocurrent measured at the QD photodetector 704. The x-axis describes the injection current provided to QD ring laser 700, wherein as the injection current increases the optical output of the QD ring laser 700 increases. One benefit of utilizing QD photodetectors is relatively low dark currents (e.g., current generated when no optical input is present). For example, in some embodiments, a QD photodetector provided an internal responsivity of approximately 0.9 A/W and a dark current of less than 0.9 nA at a bias voltage of −1. In general, QD photodetectors provide good detection combined with low dark currents and high temperature operation.

Figure 8A:
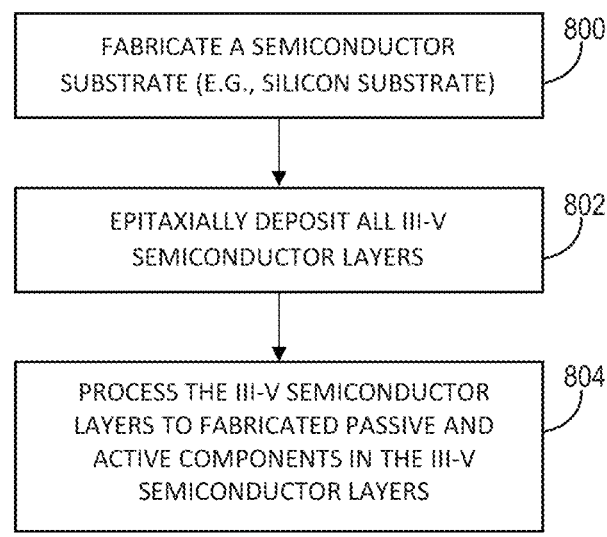
FIGS. 8a-8d are flowcharts illustrating methods of manufacturing a monolithic, quantum dot photonic integrated circuit according to some embodiments.
Figure 8B:
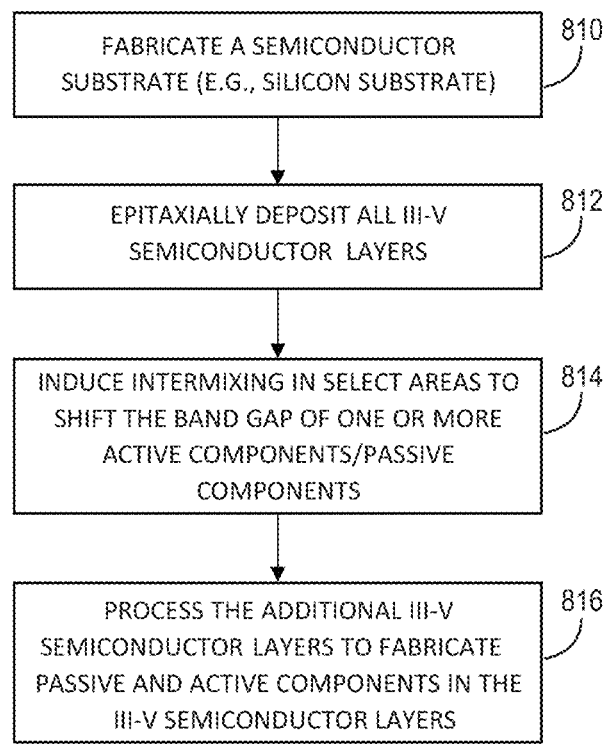
Figure 8C:
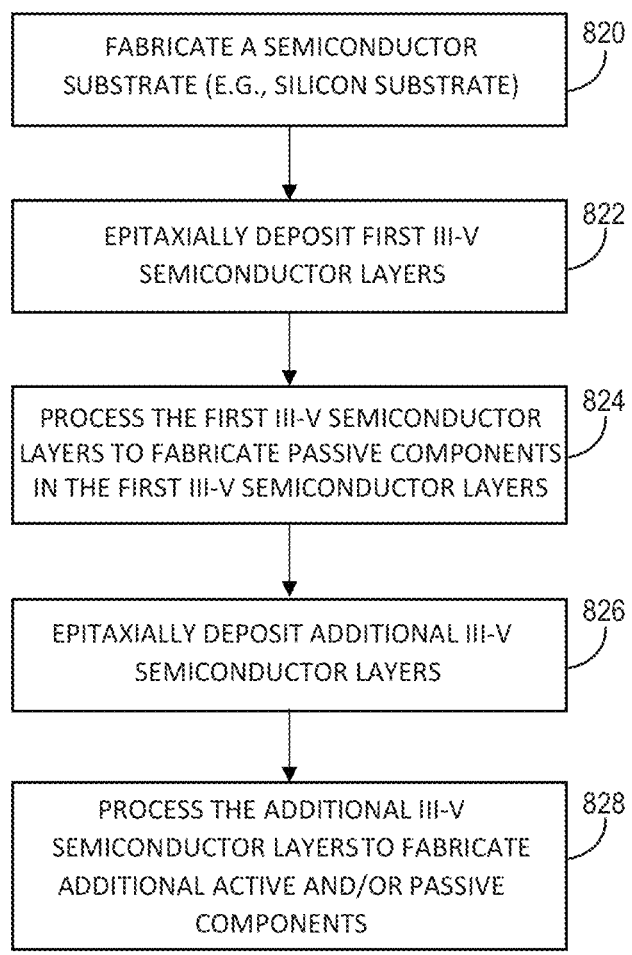
Figure 8D:
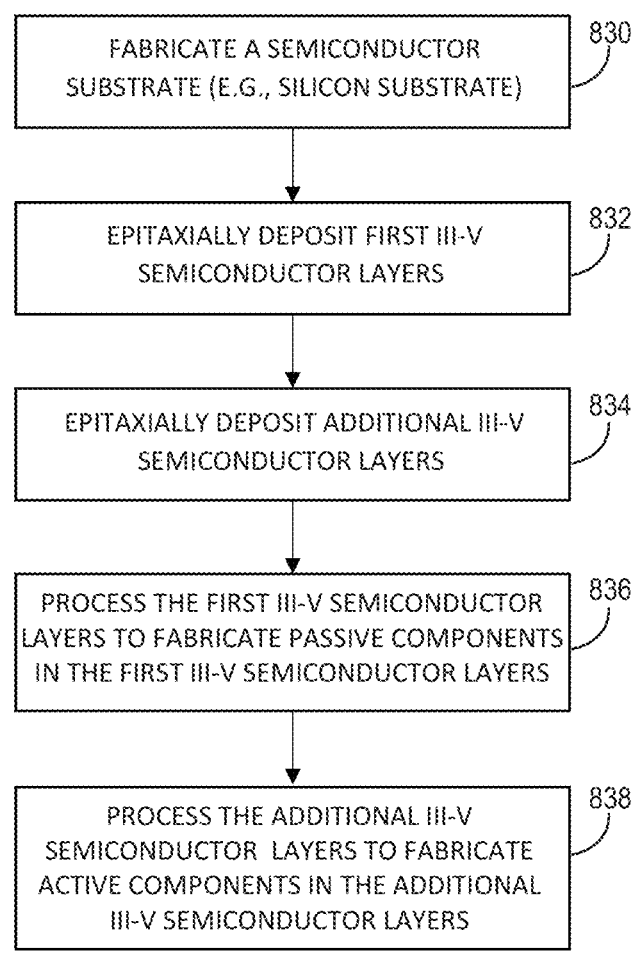

FIGS. 8a-8d are flowcharts illustrating methods of manufacturing a monolithic, quantum dot photonic integrated circuit according to some embodiments. FIG. 8a describes an approach in which all III-V semiconductor layers are deposited together without requiring regrowth. FIG. 8b describes an approach in which all III-V semiconductor layers are deposited together without requiring regrowth, and which further includes intermixing of active material to shift the bandgap associated with one or more of the components. FIGS. 8c and 8d describe methods in which a first III-V semiconductor layer is deposited and then subsequently a second III-V semiconductor layer is deposited, which requires regrowth of at least one III-V semiconductor layer.

Referring now to FIG. 8a, a method of fabricating a monolithic, quantum dot photonic integrated circuit includes at step 800 fabricating a semiconductor substrate. In some embodiments, the semiconductor substrate is comprised of silicon, which can be fabricated in a cost-efficient manner. At step 802, all of the III-V semiconductor layers are epitaxially deposited on the semiconductor substrate. This includes the deposition of a plurality of individual layers, including cladding layers, barrier layers, as well as the quantum dot (QD) layers utilized to form both the passive and active components associated with the photonic integrated circuit.

At step 804 the III-V semiconductor layers are processed to fabricate the passive and active components to be included as part of the monolithic, QD photonic integrated circuit. For example, as described with respect to FIG. 1, this may include fabrication of a plurality of active components such as a QD laser, QD modulator, and/or QD detector as well as one or more passive components such as a waveguide utilized to communicate optical signals between each of the active components. The properties of the QD layers associated with each of the one or more active components (e.g., QD laser, QD modulator and/or QD detector) depends on the composition of the III-V semiconductor layers, the kinetic restrains during growth, and patterning of the semiconductor substrate or barrier layers located below the active layers. In some embodiments, the composition of the III-V semiconductor layer may be modified with respect to the various active components in order to modify the attributes of the QD layer such as including p-doped Beryllium barrier layers between each of the QD layers. In other embodiments, the composition of the III-V semiconductor layer is homogenous for each of the plurality of active components to be processed, such that modification of the properties of the QD layers for each active component is based on the kinetic restraints during growth and/or on patterning of adjacent layers, for example as described with respect to FIGS. 3a-3b (varying the size of the quantum dots) and FIG. 5 (patterning adjacent layers to modify the QD layers).

Referring now to FIG. 8b, a method is illustrated in which intermixing is utilized to shift the band gaps associated with one or more of the active components and/or passive components. As described with respect to the embodiment shown in FIG. 8a, at step 810 the semiconductor substrate (e.g. silicon) is fabricated. At step 812, all of the III-V semiconductor layers are epitaxially deposited on the semiconductor substrate. Once again, this includes the deposition of a plurality of individual layers, including cladding layers, barrier layers, as well as the quantum dot (QD) layers utilized to form both the passive and active components associated with the photonic integrated circuit.

At step 814, as described above, intermixing is a post growth technique mixes the QD layer composition with surrounding barrier layer compositions in order to alter the composition of the QD layer—thereby altering the band-gap of the intermixed regions. In some embodiments, intermixing is performed on select portions of the monolithic photonic integrated circuit as described with respect to FIG. 3c above. For example, in some embodiments intermixing is induced in areas associated with one or more of the active components in order to vary the band-width and/or gain associated with that component. As described above, in some embodiments, intermixing is provided by inducing point defects or lattice damage that enhances interdiffusion between layers of materials, which results in mixing of the atomic composition of the layers. In other embodiments, intermixing may be provided according to other techniques, and masking of one or more areas in order to selectively induce intermixing in desired areas.

At step 816, the III-V semiconductor layers are processed to fabricate the passive and active components to be included as part of the monolithic, QD photonic integrated circuit. For example, as described with respect to FIG. 1, this may include fabrication of a plurality of active components such as a QD laser, QD modulator, and/or QD detector as well as one or more passive components such as a waveguide utilized to communicate optical signals between each of the active components. Due to the intermixing provided at step 814, one or more of the active components will have an active area with a band-gap that differs from one of the other active components. One of the benefits of the methods described with respect to FIGS. 8a and 8b is that no regrowth is required with respect to the III-V layers.

Referring now to FIG. 8c, a method is illustrated in which a first and second epitaxially layers are deposited and processed separately. As described with respect to the embodiment shown in FIG. 8a, at step 820 the semiconductor substrate (e.g. silicon) is fabricated. At step 822, a first III-V semiconductor layer (or plurality of layers) is epitaxially deposited onto the semiconductor substrate. At step 824, the first III-V semiconductor layer is processed. In some embodiments, processing of the first III-V layer may include processing to form waveguides and/or other passive components within the first III-V semiconductor layer. In some embodiments, processing the first III-V semiconductor layer includes patterning the first III-V semiconductor layer in select locations in preparation for the deposition of a second III-V semiconductor layer. The addition of a grating/pattern associated with either the semiconductor substrate and/or first III-V semiconductor layer promotes the growth of quantum dots of different sizes in the subsequently deposited second III-V semiconductor layer.

At step 826 the second or subsequent epitaxially layer is deposited on the processed III-V semiconductor layer. As discussed with respect to FIG. 5, deposition of the processed III-V semiconductor layer on patterned surfaces varies the size of the QDs in the patterned areas, thereby varying the bandwidth and/or gain of the active device associated with the patterned regions.

At step 828 the additional or second III-V semiconductor layer is processed to fabricate one or more active and/or passive components. In some embodiments, the benefit of applying a first III-V semiconductor layer and then a second III-V semiconductor layer is that it allows fabrication of active components with different QD layers attributes (e.g., QD size, band gaps, gains, etc.). In this way, a QD modulator formed on the monolithic photonic integrated circuit may have an active layer with different attributes than the QD laser formed on the same monolithic photonic integrated circuit.

Referring now to FIG. 8d, a method is illustrated in which a first and second epitaxially layers are deposited and processed separately is shown according to another embodiment. At step 830 a semiconductor substrate is fabricated (e.g. silicon substrate). At step 832, a first III-V semiconductor layer (or collection of layers) is epitaxially deposited on the silicon substrate. In some embodiments, a buffer layer may be deposited between the silicon substrate and the first layer of III-V semiconductor material. At step 834, a second III-V semiconductor layer (or collection of layers) is epitaxially deposited on the first III-V semiconductor layer. In this embodiment, the second III-V semiconductor layer is deposited on an unprocessed first III-V semiconductor layer. In some embodiments, one or more portions of the semiconductor substrate may be patterned in order to modify the size of the QD dots fabricated in the second III-V semiconductor layer.

At step 836, the first III-V semiconductor layer is processed to fabricate one or more passive components. In some embodiments, steps 834 and 836 are interchangeable, and processing of the first III-V semiconductor layer may be done prior to epitaxially depositing the second III-V semiconductor layer.

At step 838, the second layer of III-V semiconductor material is processed to fabricate one or more active components optically coupled to one another via the one or more passive components. In particular, the one or more active layers utilize techniques to fabricate active layers comprised of one or more layers of quantum dots (QD). The characteristics of the quantum dots associated with each of the plurality of active devices may be configured in order to selectively control/modify the band-gap associated with each of the plurality of active components. In some embodiments, the order in which the first III-V semiconductor layer and the second III-V semiconductor layer is processed may be interchanged. For example, the second III-V semiconductor layer may be processed prior to processing of the first III-V semiconductor layer.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A photonic integrated circuit (PIC) comprising:
a semiconductor substrate;
a first III-V type semiconductor layer located vertically adjacent to the semiconductor substrate;
one or more passive components fabricated in the first III-V type semiconductor layer;
a first active component located adjacent the one or more passive components fabricated in the first III-V type semiconductor layer; and
a second active component located adjacent the one or more passive components fabricated in the first III-V type semiconductor layer, wherein the first active component and second active component are fabricated in a second III-V type semiconductor layer located vertically adjacent to the first III-V semiconductor layer and wherein at least one of the first active component and/or the second active component includes one or more active layers comprised of quantum dots (QDs), wherein optical signals are communicated by the one or more passive components from the first active component to the second active component wherein at least one of the first active component or the second active component includes one or more active layers comprised of quantum wells (QWs).

2. The PIC of claim 1, wherein the first active component includes one or more active layers comprised of QDs and the second active component includes one or more layers comprised of quantum wells (QWs).

3. The PIC of claim 2, wherein the second active component is a QW modulator and the one or more active layers associated with a QW modulator includes modulator material regrown to increase a bandgap of the active layer of the QW modulator relative to a bandgap of the QD layers in the first active component.

4. The PIC of claim 2, wherein the first active components include one or more of a QD laser and a QD semiconductor optical amplifier (SOA) and wherein the second active components include one or more of a QW modulator and a QW photodetector.

5. The PIC of claim 1, wherein the one or more active layers associated with the first active component and/or the second active component includes a plurality of vertically stacked layers of QDs separated by p-doped regions.

6. The PIC of claim 1, wherein the one or more active layers associated with the first active component and/or one or more active layers associated with the second active component include intermixed QDs.

7. The PIC of claim 6, wherein the intermixed QDs includes intermixing between the QD composition and surrounding barrier layers.

8. The PIC of claim 1, wherein a planar surface of the semiconductor substrate, a buffer layer located between the semiconductor substrate and the first III-V semiconductor layer, and/or the first III-V semiconductor layer associated with the first active component and/or the second active component is patterned to vary a size of the QDs formed in the one or more active layers located adjacent the patterned planar surface.

9. The PIC of claim 8, wherein the pattern provided on the planar surface of the semiconductor substrate, the buffer layer, and/or the first III-V semiconductor layer includes etches having a depth x, wherein each etch is separated from adjacent etches by a distance y.

10. The PIC of claim 9, wherein the first active component is a QD laser and the second active component is a quantum well (QW) modulator.

11. The PIC of claim 10, wherein the QW modulator includes a first waveguide interferometer arm, a second waveguide interferometer arm, a first top contact associated with the first waveguide interferometer arm and a second top contact associated with the second waveguide interferometer arm.

12. A method of fabricating a monolithically integrated photonic integrated circuit (PIC), the method comprising:
   epitaxially depositing at least first and second III-V semiconductor layers on a semiconductor substrate, wherein the first III-V semiconductor layer is located vertically adjacent to the semiconductor substrate; and
   processing the first III-V semiconductor layers to fabricate passive components and processing the second III-V semiconductor layers to fabricate two or more active components, wherein at least one of the two or more active components are comprised of active regions that include quantum dot (QD) layers, wherein the QD layers are located vertically adjacent to the first III-V semiconductor layers and wherein the active components are optically coupled to one another via the passive components, wherein at least one of the two or more active components are comprised of active regions that include quantum wells (QW) layers, wherein the QW layers are located vertically adjacent to the first III-V semiconductor layers.

13. The method of claim 12, further including:
   selectively intermixing the QD layer with adjacent III-V layers in areas corresponding with one or more active components to modify the bandgap associated with the intermixed QD layer.

14. The method of claim 12, further including:
   patterning a planar surface associated with the semiconductor substrate in a region associated with either the first active optical component or the second active optical component prior to epitaxially depositing the III-V semiconductor layers.

15. The method of claim 12, wherein processing the second III-V semiconductor layers to fabricate two or more active components includes fabricating a first active component comprised of active regions that include quantum dot (QD) layers and a second active component comprised of active regions that include quantum well (QW) layers.

16. The method of claim 15, wherein the second active component is a QW modulator and the one or more active layers associated with a QW modulator includes modulator material regrown to increase a bandgap of the active layer of the QW modulator relative to a bandgap of the QD layers in the first active component.

17. The method of claim 16, wherein the first active components include one or more of a QD laser and a QD semiconductor optical amplifier (SOA) and wherein the second active components include one or more of a QW modulator and a QW photodetector.

* * * * *